United States Patent
Fukuchi et al.

(10) Patent No.: US 8,148,275 B2
(45) Date of Patent: Apr. 3, 2012

(54) METHOD FOR FORMING DIELECTRIC FILMS

(75) Inventors: Yusuke Fukuchi, Yokohama (JP); Naomu Kitano, Machida (JP)

(73) Assignees: Canon Kabushiki Kaisha, Tokyo (JP); Canon Anelva Corporation, Kawasaki-Shi (JP)

( * ) Notice: Subject to any disclaimer, the term of this patent is extended or adjusted under 35 U.S.C. 154(b) by 36 days.

(21) Appl. No.: 12/338,121

(22) Filed: Dec. 18, 2008

(65) Prior Publication Data

US 2009/0170344 A1 Jul. 2, 2009

(30) Foreign Application Priority Data

Dec. 27, 2007 (JP) .................... 2007-336731

(51) Int. Cl.
*H01L 21/71* (2006.01)
(52) U.S. Cl. .. 438/785; 438/772; 438/775; 257/E21.536
(58) Field of Classification Search .................. 438/762, 438/772, 775, 785
See application file for complete search history.

(56) References Cited

U.S. PATENT DOCUMENTS

| 7,105,362 | B2 | 9/2006 | Takahashi et al. | |
|---|---|---|---|---|
| 2003/0109114 | A1* | 6/2003 | Niwa | 438/431 |
| 2005/0236678 | A1* | 10/2005 | Sato et al. | 257/410 |
| 2005/0247985 | A1 | 11/2005 | Watanabe et al. | 257/411 |
| 2006/0008969 | A1 | 1/2006 | Takahashi et al. | |
| 2009/0170340 | A1 | 7/2009 | Kitagawa et al. | 438/766 |
| 2009/0170341 | A1 | 7/2009 | Kitano et al. | 438/770 |

FOREIGN PATENT DOCUMENTS

| CN | 1663051 A | 8/2005 |
|---|---|---|
| JP | 11-168096 A | 6/1999 |
| JP | 2001-332547 A | 11/2001 |
| JP | 2004-140292 A | 5/2004 |
| WO | 2005/050715 | 6/2005 |

OTHER PUBLICATIONS

U.S. Appl. No. 12/342,360, filed Dec. 23, 2008.
Chinese Office Action dated Dec. 18, 2010 issued in counterpart Application No. 200801906910 (English-language Translation)—4 pages.
Office Action dated Oct. 25, 2010 in Korean Application No. 10-2008-0135471 (English Translation).
Office Action dated Sep. 15, 2011, in Chinese Application 200810190691.0.

* cited by examiner

*Primary Examiner* — Alexander Ghyka
(74) *Attorney, Agent, or Firm* — Fitzpatrick, Cella, Harper & Scinto

(57) ABSTRACT

A method for forming dielectric films including metal nitride silicate on a silicon substrate, comprises a first step of depositing a film containing metal and silicon on a silicon substrate in a non-oxidizing atmosphere using a sputtering method; a second step of forming a film containing nitrogen, metal and silicon by nitriding the film containing metal and silicon; and a third step of forming a metal nitride silicate film by oxidizing the film containing nitrogen, metal and silicon.

6 Claims, 6 Drawing Sheets

METHOD FOR FORMING DIELECTRIC FILMS

BACKGROUND OF THE INVENTION

1. Field of the Invention

The present invention relates to a method for forming dielectric films and, in particular, to a method for forming dielectric films including metal nitride silicate suitable for use as a high permittivity constant gate dielectric films in a semiconductor device.

2. Description of the Related Art

A semiconductor device such as MOS (Metal Oxide Semiconductor) transistors have been accelerated in channel length reduction because of implementation of high operating speed. However, much reduction in the channel length lowers the electrostatic capacity of gate dielectric films, thus causing malfunction of a transistor's switching operations. Accordingly, thinning the gate dielectric films provide electrostatic capacity capable of switching operations of transistors. Conventionally, as a material of the gate dielectric films of a MOS transistor, a silicon dioxide film ($SiO_2$) capable of good interface characteristics in a simple manufacturing process has been used. However, with a decrease in the film thickness of the gate dielectric films up to approximately several nm, gate leaks by tunnel current generate in large quantity, thus causing a problem of high power consumption. As means for solving this problem, there has been proposed a method for forming gate dielectric films using a material having higher relative permittivity constant than relative permittivity constant $\in_r=3.9$ of $SiO_2$. The dielectric films made of such a material is referred to as high permittivity constant dielectric films (high-k dielectric films). The high-k dielectric films can increase, as the material has higher relative permittivity constant, the film thickness to a required degree to obtain the same electrostatic capacity as that of a silicon dioxide film, thereby inhibiting an increase in leakage current.

As one candidate of materials of high-k dielectric films, for example, metallic dioxide such as $ZrO_2$ and $HfO_2$ has been proposed. Conventionally, as a method for depositing such a metallic dioxide on a surface of a substrate, there has been known MOCVD (Metal Organic Chemical Vapor Deposition) disclosed in Japanese Patent Application Laid-Open No. 2004-140292 (US counterpart U.S. Pat. No. 7,105,362, US Patent Application Publication 2006/0008969). According to the MOCVD method, a metallic complex raw material is put in a raw material tank, heated with a heater to become a liquid state and carrier gas is flowed into the raw material tank to vapor raw material and is transferred into a reaction chamber. The raw material transferred to the reaction chamber is deposited onto a surface of a heated substrate, thus implementing film formation.

However, the film formed according to the MOCVD method is a film including many impurities such as carbon or hydrogen derived from an organic raw material. There has occurred the following problem: the film formed according to the MOCVD method tends to generate a large amount of leakage current by an influence of residual impurities. As another method for depositing, on a substrate, metallic dioxide including few impurities derived from a raw material like the MOCVD method, a sputtering method has been known. According to the sputtering method, for example, by making noble gas such as Ar ionized by plasma collide with a surface of a target, atoms constituting the target are rejected and deposited on a surface of the substrate. The content of impurities in the deposited film is less than that according to MOCVD. By performing sputtering using a plurality of targets containing different elements, films having various compositions can be easily formed. For example, using a target made of metal and a target made of Si, the targets are sputtered at the same time to deposit a film containing metal and silicon. By oxidizing such a film, a metal silicate film can be easily formed.

Referring now to FIGS. 5A through 5E, a conventional method for manufacturing high-k dielectric films to which a sputtering method is applied will be described below. Reference numeral 201 denotes a substrate containing single-crystal silicon, reference numeral 202 denotes a silicon dioxide film, reference numeral 203 denotes a film containing metal and silicon, reference numeral 204 denotes a metal silicate film and reference numeral 205 denotes a metal nitride silicate film.

In a step of FIG. 5A, first, contaminants on a surface of the substrate 201 are removed according to a known RCA cleaning method to expose silicon atoms on a surface of the substrate 201.

Next, in a step of FIG. 5B, a surface of the substrate 201 is oxidized to form a silicon dioxide film 202. As a method for oxidizing the substrate 201, any method of thermal oxidizing method, radical oxidizing method and the like may be used if the method provides a good silicon interface.

Next, in a step of FIG. 5C, by performing sputtering with a target containing metal and a target containing silicon, a film 203 containing metal and silicon is deposited on a surface of the silicon dioxide film 202.

Further, in a step of FIG. 5D, the film 203 containing metal and silicon is oxidized by oxygen radical to form a metal silicate film 204. Oxidization of the film 203 containing metal and silicon can be implemented by a radical oxidizing method capable of low-temperature oxidization without use of thermal oxidizing method. Generally, metal oxide film and metal silicate film is lower in thermal stability than silicon dioxide film. In the thermal oxidizing method for performing oxidization at a high temperature, the metal silicate film in an amorphous state may be crystallized. The crystallized metal silicate film tends to generate a leakage current. Accordingly, the radical oxidization capable of low-temperature oxidization is suitable. As a unit for generating oxygen radical, any generating method of plasma excitation, optical excitation or the like may be used if active oxygen radical can be formed. Otherwise, in performing sputtering, sputtering while introducing oxidization reaction gas such as oxygen, that is, reactive sputtering may be used. In this case, the atom sputtered from the target is oxidized and is deposited on the substrate as an oxide, thus omitting an oxidizing step after sputtering.

Next, in a step of FIG. 5E, the metal silicate film 204 is nitrided to form a metal nitride silicate film 205. Thermal stability is improved by nitriding the metal silicate film 204 and diffusion of impurities from an electrode formed on the gate dielectric films can be inhibited. In nitriding the metal silicate film 204, nitrogen plasma can be used. Using nitrogen plasma enables the metal silicate film to be nitrided at a lower temperature than for thermal nitriding. In thermal nitriding, however, nitrogen atoms are diffused close to a surface of the substrate 201 or close to an interface with silicon, which may cause performance degradation such as degradation of channel mobility. On the other hand, plasma nitriding enables only proximity to a surface of the silicate film to be selectively nitrided, thus providing resistance to causing such degradation.

Referring to FIGS. 6A through 6D, description will be made on another conventional embodiment in manufacturing high-k dielectric films to which a sputtering method is applied.

In a step of FIG. 6A, contaminations on a surface of the substrate 201 are removed by a known RCA cleaning method to expose silicon atom on a surface of the substrate 201.

Next, in a step of FIG. 6B, a film 203 containing metal and silicon is deposited on a surface of the substrate 201 by performing sputtering using a target made of metal and a target made of silicon.

Further, in a step of FIG. 6C, a metal silicate film 204 is formed by oxidizing the film 203 containing metal and silicon. At that time, upon oxidizing species' reaching the substrate 201, silicon on a surface layer portion of the substrate is oxidized to form a silicon oxide film 202 between the substrate 201 and the metal silicate film 204.

Further, in a step of FIG. 6D, the metal silicate film 204 is nitrided to form a metal nitride silicate film 205.

Hence, it is possible to form high-k dielectric films having the same structure as the one obtained by the method described in FIGS. 5A through 5E.

On the other hand, Japanese Patent Application Laid-Open No. H11-168096 discloses a method for directly forming high-k dielectric films on a silicon layer without degradation in the characteristics of the high-k dielectric films. After the high permittivity nitride films are formed on the silicon layer, the high permittivity nitride films are oxidized to be changed into high permittivity oxide films. However, this can form high permittivity oxide films, but cannot form a metal nitride silicate film.

Oxygen is diffused very fast in the film containing metal and silicon and, according to a method illustrated in FIGS. 5A through 5E and 6A through 6D, it is easy for oxygen to penetrate through the film containing metal and silicon and diffuse up to the ground in a step for oxidizing the film containing metal and silicon. Hence, the substrate containing the ground silicon is oxidized to cause an increase in a film thickness of the silicon dioxide film and an insulation film containing the silicon dioxide film (an increase in film thickness), thus causing a problem of difficulty in obtaining a film thickness of each film as designed. Conventionally, because controllability of a film thickness of the silicon dioxide film and that of an insulation film containing the silicon dioxide film were poor, countermeasures therefor have been demanded.

Further, problems in nitriding the metal silicate film will be described below.

The concentration of nitrogen atom in plasma-nitriding an Hf silicate film formed by using Hf (hafnium) as a metal material was measured by XPS (X-ray-induced photoelectron spectroscopy). The composition between the atoms of Hf atom and Si atom included in the Hf silicate film was in a ratio 1:1. In comparison, the concentration of nitrogen atom was similarly measured in nitriding the silicon dioxide film under the same nitriding conditions. As the result, the surface density of nitrogen atom introduced into the silicon dioxide film is $6.5 \times 10^{15}$ atoms/cm$^2$, while the surface density of nitrogen atom introduced into the Hf silicate film was $1.2 \times 10^{15}$ atoms/cm$^2$. In spite of nitriding under the same conditions, the amount of nitrogen atoms in the Hf silicate film was smaller than that in the silicate oxide film. To increase the amount of nitrogen atoms introduced into the Hf silicate film, nitriding conditions such as prolonging the nitriding time have been studied, but is understood more difficult to introduce nitrogen atoms into the Hf silicate film than the silicon dioxide film. This is not only seen in the metal silicate film using Hf as metal but as is the case with the metal silicate film using another metal such as Zr. This is as in the case of a thermal nitriding method instead of a plasma nitriding method. Further, it is understood that nitriding is more difficult as the composition ratio of metal atoms in relation to Si atoms in the silicate film is higher.

Because it has conventionally been difficult to nitride the silicate film having a high composition ratio of metal in a high concentration, various measures therefor have been demanded.

SUMMARY OF THE INVENTION

In view of the above-described problems, it is an object of the present invention to form dielectric films suitable for use as high permittivity constant gate dielectric films and including a high permittivity constant metal nitride silicate film.

According to the present invention, in order to reach the object there is provided a method for forming dielectric films which form dielectric films including metal nitride silicate on a silicon substrate, comprising: a first step of depositing a film containing metal and silicon on the silicon substrate in a non-oxidizing atmosphere using a sputtering method; a second step of forming a film containing nitrogen, metal and silicon by nitriding the film containing metal and silicon; and a third step of forming a metal nitride silicate film by oxidizing the film containing nitrogen, metal and silicon.

In the present invention, preferably, the metal includes either one of hafnium (Hf) or zirconium (Zr).

In the present invention, preferably, the film containing metal and silicon is retained in such an atmosphere that it is difficult for metal atom and silicon atom to have an oxidization reaction (non-oxidizing atmosphere) during a period from completion of the first step to start of the second step. In the present invention, preferably, the film containing metal and silicon is nitrided using plasma including at least nitrogen atom in the second step. In the present invention, preferably, the film containing nitrogen, metal and silicon is oxidized using plasma including at least oxygen atom in the third step.

In the present invention, preferably, a surface layer portion of the silicon substrate under the film containing nitrogen, metal and silicon is oxidized in the third step to form a silicon dioxide film. In the present invention, preferably, a surface layer portion of the silicon substrate is oxidized in the first step to form a silicon dioxide film and a film containing metal and silicon is deposited on the silicon dioxide film.

In addition, according to the present invention, in order to reach the object there is provided a method for forming an insulation film which forms an insulation film including a metal nitride silicate on a silicon substrate, comprising: a first step of depositing a film containing nitrogen, metal and silicon on the silicon substrate in a non-oxidizing atmosphere by a reactive sputtering method using gas including at least nitrogen atom and a second step for oxidizing the film containing nitrogen, metal and silicon to form a metal nitride silicate.

In the present invention, preferably, the metal includes either one of hafnium (Hf) and zirconium (Zr).

In the present invention, preferably, the film containing nitrogen, metal and silicon is oxidized using plasma including at least oxygen atom in the second step. In the present invention, preferably, a surface layer portion of the silicon substrate under the film containing nitrogen, metal and silicon is oxidized in the second step to form a silicon dioxide film.

In the present invention, preferably, a surface layer portion of the silicon substrate is oxidized in the first step to form a silicon dioxide film and a film containing nitrogen, metal and silicon is deposited on the silicon oxide film.

The present invention is suitable for use as high permittivity constant gate dielectric films and can form gate dielectric films which are excellent in thermal stability and includes a metal nitride silicate film having high relative permittivity constant.

Further features of the present invention will become apparent from the following description of exemplary embodiments with reference to the attached drawings.

DESCRIPTION OF THE EMBODIMENTS

Figure 1A:
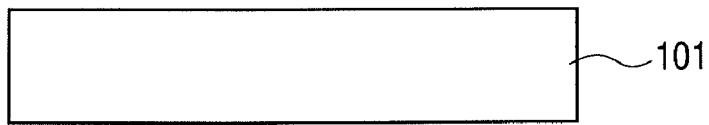
FIGS. 1A, 1B, 1C and 1D are step sectional views for describing a first embodiment of a method for manufacturing dielectric films according to the present invention.

Preferred embodiments of the present invention will now be described in detail in accordance with the accompanying drawings.

(First Embodiment)

FIGS. 1A through 1D are step sectional views for describing a first embodiment of the present invention. Reference numeral 101 denotes a silicone substrate, at least on the surface of which silicon atom is exposed. Reference numeral 102 denotes a film containing metal and silicon, reference numeral 103 denotes a film containing nitrided metal and silicon, that is, a film containing nitrogen, metal and silicon, reference numeral 104 denotes metal nitride silicate film and reference numeral 105 denotes a silicon dioxide film. An insulation film includes a metal nitride silicate film 104 and a silicon dioxide film 105. The presence of the silicon dioxide film 105 improves interface characteristics and the electrical insulation properties of the dielectric films. The silicon dioxide film 105 has a smaller relative permittivity constant than the metal nitride silicate film 104 and preferably, the film thickness of the silicon dioxide film 105 is made smaller than that of the metal nitride silicate film 104. For example, preferably, the film thickness of the metal nitride silicate film 104 is 1 nm to 5 nm and more preferably, 1.5 nm to 3 nm. In addition, preferably, the film thickness of the silicon dioxide film 105 is 0.5 nm to 2 nm and more preferably, 0.5 nm to 1.5 nm.

As the silicon substrate 101, a substrate containing, for example, monocrystalline silicon having (100) plain orientation, where further phosphorus is doped and the resistance value thereof is controlled to the range from 0.1 Ω·cm to 10 Ω·cm, can be used. In the present invention, the silicon substrate 101 is not limited to the above-described example and the one having plane orientation, dopant and resistance value different from the above one may be used if silicon atom has exposed on the surface on which a film is deposited. Further, the one formed by growing silicon on a substrate composed of a material other than silicon by means of the epitaxial method may be also used.

In a step illustrated in FIG. 1A, first, using the known RCA cleaning method, metal, an organic substance, particles and natural oxide film on a surface of the silicon substrate 101 are removed to expose a clean silicon atom on a surface.

Figure 1B:
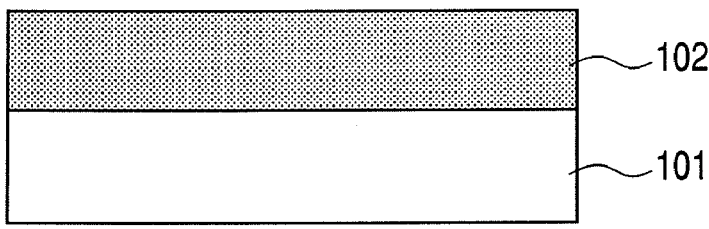

Next, in a step illustrated in FIG. 1B (a first step), on a surface of the silicon substrate 101, a film 102 containing metal and silicon by the sputtering method is deposited in such an atmosphere that it is difficult for metal atom and silicon atom to have an oxidization reaction (non-oxidizing atmosphere).

The non-oxidizing atmosphere in the present invention refers to an atmosphere in which a Si substrate 101 does not oxidize. Preferably, the non-oxidizing atmosphere is containing at least any one of He, Ne, Ar, Kr and Xe which are noble gas and $N_2$ which is reactive gas. In addition, it is preferable that an oxygen partial pressure of the non-oxidizing atmosphere is $1 \times 10^{-5}$ Pa or less.

The composition ratio of metal atom and silicon atom included in the film 102 containing metal and silicon can be changed as needed so that permittivity constant after formation of dielectric films are a desired value. It is preferable that the concentration (percentage content) of silicon atom included in the film 102 containing metal and silicon is 10 atoms % or more. By setting a ratio of silicon atom to a total of metal atom and silicon atom at 10 atoms % or more in this way, the thermal stability of a film can be improved and crystal growth in a film can be inhibited. In addition, the amount of nitrogen incorporated in a film during nitriding described below can be increased. During deposit of metal atom and silicon atom in this step, the composition ratio of metal atom to silicon atom does not always require to be constant and the composition ratio changing in a depth direction may be used.

As metals to be deposited, for example, there are Al, Sr, Ba, Sc, Y, Ti, Zr, Hf and Ta as well as lanthanoid series metal such as La and Ce. Preferably, the metal to be used is at least either one of hafnium (Hf) and zirconium (Zr). Hf or Zr can obtain high permittivity constant after formation of dielectric films and is excellent in thermal stability. Metal to be deposited may be either of the one containing a single element or the one containing a plurality of metal elements. Further, the one formed by laminating a metal film of different element may be used. During and after deposit of the film 102 containing metal and silicon, for metal atom and silicon atom to have difficulty in causing an oxidization reaction, preferably, for example, the oxygen partial pressure of the atmosphere is sufficiently lowered. In other words, preferably, from the completion of a first step to the start of a second step described later, a film containing metal and silicon is retained in such an atmosphere that an oxidization reaction thereof is difficult to generate.

Specifically, it is preferable that oxygen partial pressure is $1 \times 10^{-5}$ Pa or less.

Figure 1C:
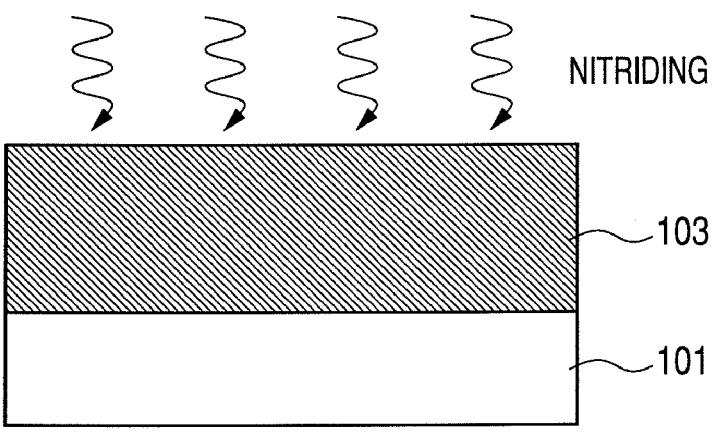

Next, in a step of FIG. 1C (second step), the film 102 containing metal and silicon is nitrided to form a film 103 constructed from nitrogen, metal and silicon. The metal and silicon not oxidized is easily nitrided and nitrogen atom can be incorporated into a film with higher concentration than a case where a metal silicate film in an oxidized state is nitrided in a conventional way. For example, the concentration (percentage content) of nitrogen atom in the film 103 containing nitrogen, metal and silicon can be set at 1 atom % (incl.) through 25 atom % (incl.).

Preferably, the film 102 containing metal and silicon deposited in a step of FIG. 1B is retained in an atmosphere in which an oxidization reaction thereof is difficult to generate, so as not to be oxidized before nitriding. Specifically, preferably, the film 102 containing metal and silicon is retained in an atmosphere in which an oxidization reaction thereof is difficult to generate, from completion of a first step to start of a second step. For example, a processing apparatus for sputtering and a processing apparatus for nitriding are connected directly with each other or through a load lock chamber depressed to high vacuum. Hence, the silicon substrate 101 formed with the film 102 containing metal and silicon can be transferred by a substance transfer unit so as not to be exposed to oxidizing atmosphere. Otherwise, preferably, sputtering and nitriding are continuously performed in the same processing apparatus so that the film 102 containing metal and silicon is not exposed to oxidizing atmosphere. Or, in carrying out the silicon substrate 101 outside the processing apparatus after completion of sputtering, the silicon substrate may be passed through only a path filled with inert gas such as noble gas or nitrogen gas. The above is not limited to these examples and any unit may be used unless the film 102 containing metal and silicon is not oxidized.

A method for nitriding the film 102 containing metal and silicon may use any method such as thermal nitriding method or plasma nitriding method, but the plasma nitriding method is preferable. In the case of nitriding with heat treatment at high temperature, a film phase-separates and a metallic crystal of metallic silicide is generated in the film and hence inhomogeneity may occur. On the other hand, in plasma nitriding, the film 102 containing metal and silicon can be nitrided at a low temperature, thus maintaining a homogeneous amorphous state. In performing nitriding with plasma, any system of ICP, helicon, ECR, microwave and surface wave may be used as a plasma source. The nitrogen-containing gas used for nitriding includes $N_2$, $NH_3$, $N_2H_4$ and hexamethyldisilazane (HMDS). Nitrogen-containing gas may be supplemented with noble gas such as He, Ne, Ar, Kr and Xe.

Figure 1D:
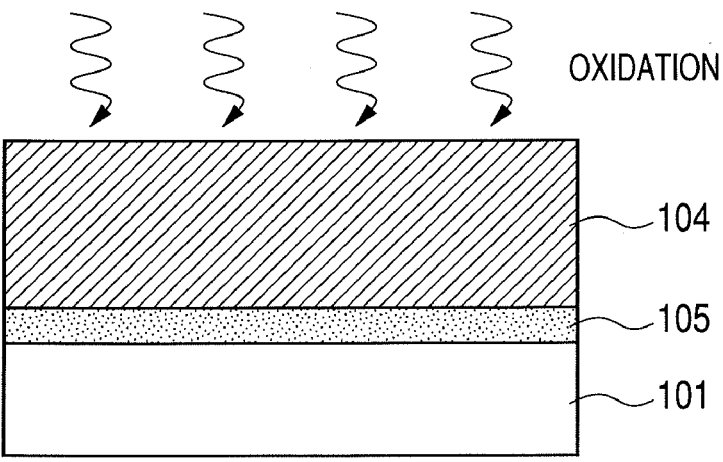

Next, in a step illustrated in FIG. 1D (a third step), the film 103 containing nitrogen, metal and silicon is oxidized. Hence, the metal atom or silicon atom in the film 103 which has not completely nitrided by nitriding is oxidized. In addition, a reaction in which a part of the nitrogen atom bonded to metal atom and silicon atom is replaced with oxygen atom or a reaction in which oxygen atom is inserted into between metal and nitrogen bond and between silicon and nitrogen bond also performs oxidization. Such an oxidization reaction forms a metal nitride silicate film 104.

During the oxidization, a part of oxygen penetrates through the film 103 by diffusion and the surface layer portion of the silicon substrate 101 thereunder is oxidized to form the silicon dioxide film 105.

In a conventional typical method, the oxidization is performed before nitriding and, in the film containing metal and silicon, oxygen diffusion is large and therefore oxygen tends to penetrate through during the oxidizing. Accordingly, the ground silicon substrate is excessively oxidized, so that silicon nitride films tended to rapidly increase in number and the silicon dioxide film having a small film thickness was difficult to form with high controllability.

On the other hand, in the present invention, oxidizing is performed after nitriding and oxygen diffusion in the film 103 containing nitrided metal and silicon is smaller than a conventional film containing unnitrided metal and silicon. Accordingly, the present invention inhibits oxygen from rapidly penetrating through the ground during oxidization. Hence, the present invention is excellent in film thickness controllability of the silicon dioxide film 105 formed by oxidizing the surface layer portion of the ground silicon substrate 101 than the conventional method.

A method for oxidizing the film 103 containing nitrided metal and silicon may use any method such as thermal oxidizing method or plasma oxidizing method, but the plasma oxidizing method is preferable. Use of plasma oxidizing capable of oxidizing at a low temperature can inhibit crystal growth in the formed metal nitride silicate film 104. In the case of oxidization with plasma, preferably, a plasma source uses plasma using a high frequency of 40 MHz or more. Further, it is particularly preferable to use a microwave plasma source such as surface wave interference plasma. The microwave plasma has a low electronic temperature of approximately 2 eV or less and a processing apparatus using the microwave plasma as a plasma source can decrease ion injection energy into a substrate. Oxidization with such a plasma source of low electronic temperature can oxidize the film 103 containing metal and silicon while inhibiting excessive oxidization of the ground silicon substrate 101. The oxygen-containing gas used for oxidization includes, for example, $O_3$, $H_2O$, NO, $N_2O$ and $NO_2$. In addition, a mixture of these gases or the one formed by diluting oxygen-containing gas with noble gas such as $H_2$, $N_2$, He, Ne, Ar, Ke, or Xe may be used.

The metal nitride silicate film 104 formed in this way has a high nitrogen concentration (nitrogen percentage content) and high relative permittivity constant, is excellent in thermal stability and is suitable for use as high permittivity constant gate dielectric films. For example, the nitrogen concentration (percentage content) can be set at 1 atom % (inclusive) to 20 atom % (inclusive). The relative permittivity constant can be set at 10 (inclusive) to 20 (inclusive). In addition, a method for forming an insulation film according to the present invention has a feature of precise controllability of film thickness, particularly the film thickness of a silicon dioxide film than a conventional method.

(Second Embodiment)

Referring next to FIGS. 2A to 2E, detailed description will be made on a second embodiment of the present invention. In these figures, the same portions or members as those in FIGS. 1A through 1D have the same reference numerals and therefore the description thereof will not be repeated.

Figure 2A:
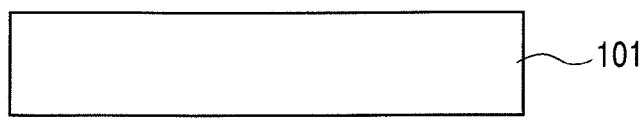
FIGS. 2A, 2B, 2C, 2D and 2E are step sectional views for describing a second embodiment of the method for manufacturing dielectric films according to the present invention.

In a step of FIG. 2A, clean silicon atom is exposed on a surface in the same way as that of FIG. 1A.

Figure 2B:
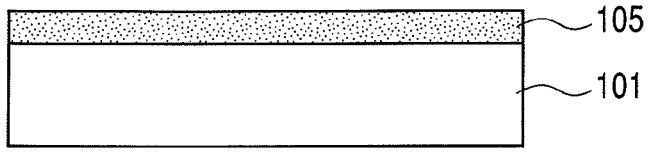

Next, in a step of FIG. 2B, silicon of a surface layer portion of the silicon substrate 101 is oxidized to form a silicon dioxide film 105. Hence, a good interface of silicon of the silicon substrate 101 to the silicon dioxide film 105 constructing an insulation film can be obtained. A method for oxidizing a surface layer portion of the silicon substrate 101 includes an approach to obtaining a good silicon interface, such as thermal oxidizing method. For example, as the thermal oxidizing method, oxidization with a hot wall thermal oxidizing furnace or an infrared lamp rapid thermal oxidizing apparatus is applicable. In the case of oxidization with a thermal oxidization furnace, either of dry oxidization and a wet oxidization of performing oxidization with gas which has been obtained by passing oxygen gas through pure water with carrier gas such as argon gas and nitrogen gas may be used. Otherwise, combustion oxidization (pyrogenic) method with oxygen gas and hydrogen gas may be used. As the oxygen-containing gas used for oxidization other than the above examples, $O_3$, $H_2O$, NO, $N_2O$ and $NO_2$ are used.

Figure 2C:
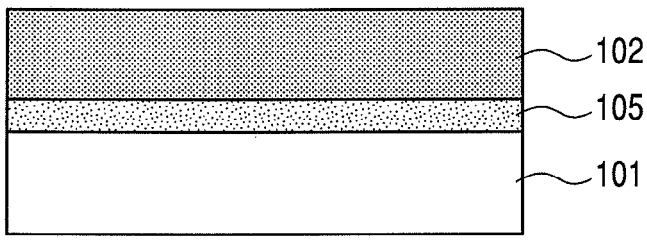

Next, in a step of FIG. 2C, on the silicon oxide film 105, the film 102 containing metal and silicon is disposed in such an atmosphere that it is difficult for metal atom and silicon atom to have an oxidization reaction by sputtering method. This is the same as the step of FIG. 1B, except that the silicon dioxide film 105 is intervened.

The first step of the present invention is constructed from the steps of FIGS. 2B and 2C.

Figure 2D:
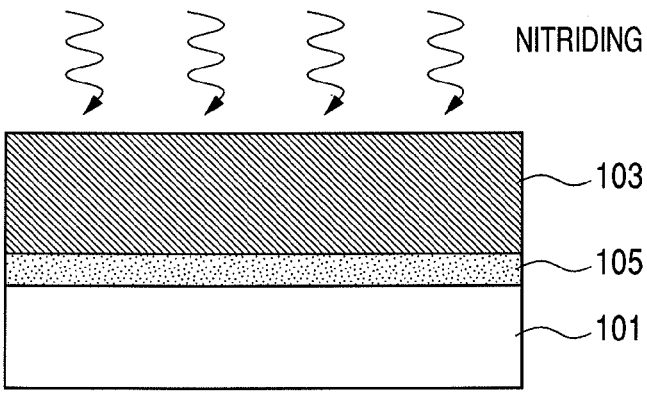

Next, in a step of FIG. 2D (a second step), the film 102 containing metal and silicon is nitrided in the same way as that of FIG. 1C to form a film 103 containing nitrogen, metal and silicon.

Figure 2E:
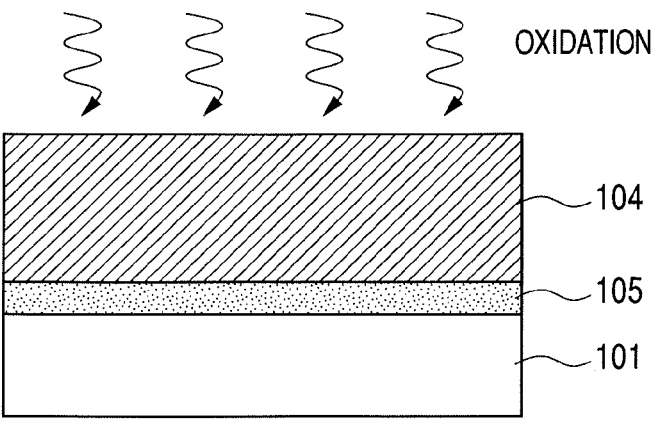

Next, in a step of FIG. 2E (a third step), the film 103 containing nitrided metal and silicon is nitrided in the same way as that of FIG. 1D to form a metal nitride silicate film 104.

During the oxidization, a part of oxygen penetrates through the film 103 by diffusion. However, the part of oxygen does not reach the interface of the silicon dioxide film 105 to the silicon substrate 101.

For EOT to reach 1 nm or less, the first embodiment is the best, but when EOT is larger than 1 nm, preferably, like a second embodiment, after a silicon dioxide film of an approximately 1 nm is formed, for example, by the rapid thermal oxidizing method, a film containing metal and silicon is formed and is nitrided before oxidization. This is because a good interface of silicon to the silicon dioxide film can be obtained. Specifically, as described above, an interface of silicon to a silicon dioxide film formed by thermal oxidization is good. Further, the silicon oxide film formed in this way has good film quality, minuteness and resistance to oxygen permeability and therefore oxide films of approximately 1 nm are not increased in number, retaining an interface of silicon to the silicon dioxide film in a good state.

(Third Embodiment)

Figure 3A:
FIGS. 3A, 3B and 3C are step sectional views for describing a third embodiment of the method for manufacturing dielectric films according to the present invention.
Figure 3B:
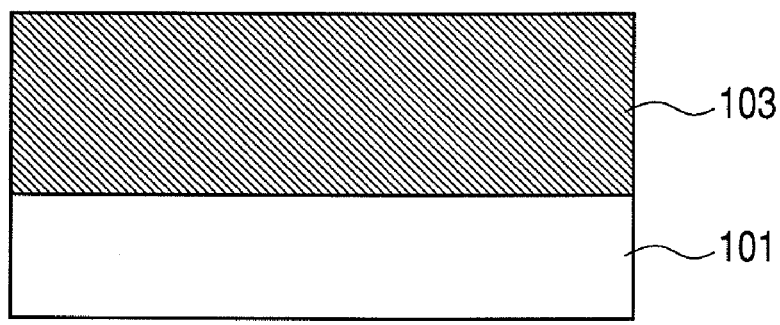
Figure 3C:
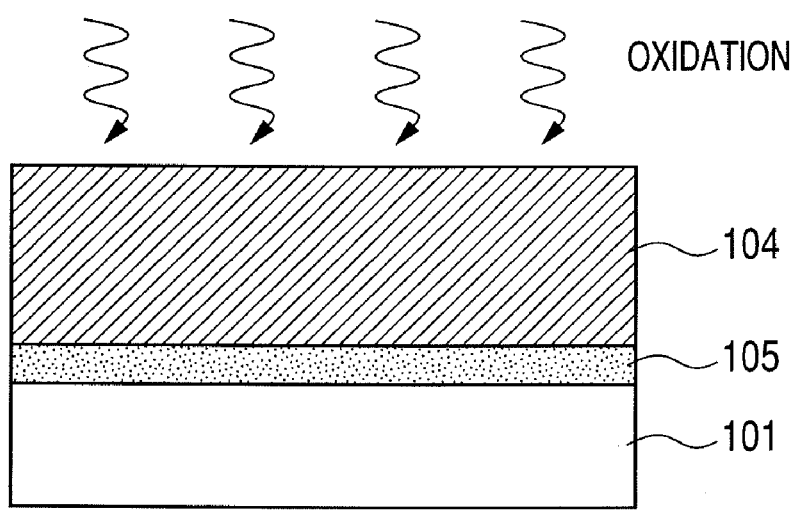

Referring next to FIGS. 3A through 3C, detailed description will be made on a third embodiment of the present invention. In these figures, the same portions or members as those in FIGS. 1A through 1D or FIGS. 2A through 2E have the same reference numerals and therefore the description thereof will not be repeated.

In a step of FIG. 3A, clean silicon atom is exposed on a surface in the same way as that of FIG. 1A or FIG. 2A.

Next, in a step of FIG. 3B (a first step), in such an atmosphere that it is difficult for metal atom and silicon atom to have an oxidization reaction, a film containing nitrided metal and silicon, that is, the film 103 containing nitrogen, metal and silicon is disposed on the silicon substrate 101 by the reactive sputter method using reactive gas including at least nitrogen atom.

The composition ratio of metal atom and silicon atom included in the film 103 containing nitrogen, metal and silicon can be changed as needed so that a relative permittivity constant after formation of an insulation film is a desired value. Preferably, a ratio of silicon atom to a total of metal atom and silicon atom included in the film 103 containing nitrogen, metal and silicon is 10 atoms % or more, thereby improving film thermal stability and inhibiting in-film crystal growth. During formation of a deposited film in this step, the composition ratio of metal atom to silicon atom is not always constant and the composition ratio may be changed in a depth direction.

As metals to be deposited, for example, there are Al, Sr, Ba, Sc, Y, Ti, Zr, Hf and Ta as well as lanthanoid series metal such as La and Ce. It is preferable to select at least either one of Hf and Zr. Hf or Zr provides a high relative permittivity constant after formation of dielectric films and is excellent in thermal stability. Metal to be deposited may be either one of the one containing a single element and the one containing a plurality of metal elements. Further, the one formed by laminating a metal film of different element may be used. During formation of a deposited film by the reactive sputtering method, it is preferable, for example, to maintain an environment in which oxygen partial pressure is sufficiently low so that it is difficult for metal atom and silicon atom to have an oxidation reaction. Specifically, preferably, oxygen partial pressure is $1 \times 10^{-5}$ Pa or less.

Next, in a step of FIG. 3C (a second step), the film 103 containing nitrogen, metal and silicon is oxidized. Hence, the metal atom or silicon atom in the film 103 which has not completely nitrided by reactive sputtering process is oxidized. In addition, a reaction in which a part of the nitrogen atom bonded to metal atom and silicon atom is replaced with oxygen atom or a reaction in which oxygen atom is inserted into between metal and nitrogen bond and between silicon and nitrogen bond also performs oxidization. Such an oxidization reaction forms a metal nitride silicate film 104.

During the oxidization, a part of oxygen penetrates through the film 103 by diffusion and the surface layer portion of the silicon substrate 101 thereunder is oxidized to form a silicon oxide film 105.

In a conventional typical method, the oxidization is performed before nitriding and, in the film containing metal and silicon, oxygen diffusion is large and therefore oxygen tends to penetrate through during the oxidizing. Accordingly, the ground silicon substrate is excessively oxidized, so that silicon nitride films tended to rapidly increase in number and the silicon dioxide film having a thin film thickness was difficult to form with precise controllability.

On the other hand, in the present invention, oxidizing is performed after formation of the film 103 containing nitrided metal and silicon and oxygen diffusion in the film 103 containing nitrogen, metal and silicon is smaller than in a conventional film containing unnitrided metal and silicon. Accordingly, the present invention inhibits oxygen from rapidly penetrating through the ground during oxidization. Hence, the present invention is excellent in the thickness film controllability of the silicon oxide film 105 formed by oxidizing the surface layer portion of the ground silicon substrate 101 than the conventional method.

As a method for oxidizing the film 103 containing nitrided metal and silicon, any method such as thermal oxidizing method and plasma oxidization may be used, but preferably plasma oxidization is used. By using plasma oxidization capable of oxidization at a low temperature, crystal growth can be inhibited in the formed metal nitride silicate film 104. In performing oxidization with plasma, preferably plasma using a high frequency of 40 MHz is used as a plasma source. Further, for example, particularly preferably, a microwave plasma source such as surface wave interference plasma is used. Microwave plasma has a low electronic temperature of 2 eV or less and a processing apparatus using microwave plasma can lower ion injection energy into a substrate. Oxidization with such a plasma source of low electronic temperature can oxidize the film 103 containing metal and silicon while inhibiting excessive oxidization of the ground silicon substrate 101. The oxygen-containing gas used in oxidization includes, for example, $O_3$, $H_2O$, NO, $N_2O$ and $NO_2$. In addition, a mixture of these gases or the one formed by diluting oxygen-containing gas with noble gas such as $H_2$, $N_2$, He, Ne, Ar, Ke, or Xe may be used.

The metal nitride silicate film 104 formed in this way has a high nitrogen concentration and high relative permittivity constant in the same way as for the first embodiment, is excellent in thermal stability and suitable for use as high permittivity constant gate dielectric films. In addition, the method for forming dielectric films according to the present invention can reduce the number of steps and form dielectric films having a thin electrical film thickness (converted oxidized film thickness) with high controllability and has a feature of precise controllability of thickness film.

(Fourth Embodiment)

Referring next to FIGS. 4A through 4D, detailed description will be made on a fourth embodiment of the present invention. In these figures, the same portions or members as those in FIGS. 1A to 1D through FIGS. 3A to 3C have the same reference numerals and therefore the description thereof will not be repeated.

Figure 4A:
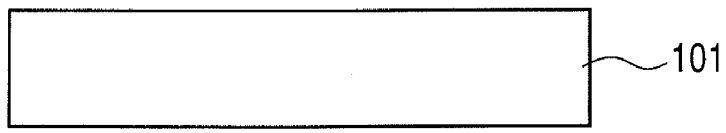
FIGS. 4A, 4B, 4C and 4D are step sectional views for describing a fourth embodiment of the method for manufacturing dielectric films according to the present invention.

In a step of FIG. 4A, clean silicon atom is exposed on a surface in the same way as those of FIG. 1A, FIG. 2A and FIG. 3A.

Figure 4B:
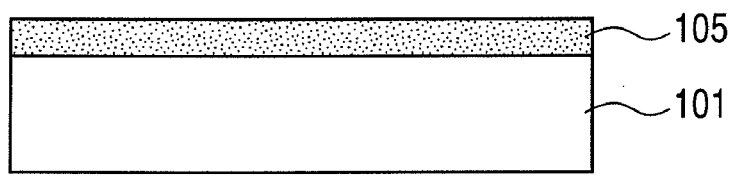

Next, in a step of FIG. 4B, silicon of a surface layer portion of the silicon substrate 101 is oxidized in the same way as the step of FIG. 2B to form a silicon dioxide film 105. Hence, a good interface of silicon of the silicon substrate 101 to the silicon dioxide film 105 constituting an insulation film is obtained.

Figure 4C:
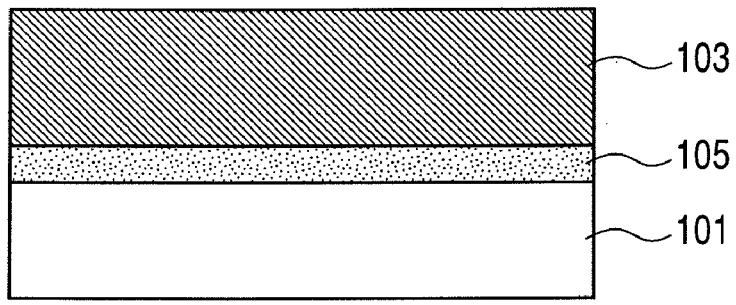

Next, in a step of FIG. 4C, in such an atmosphere that it is difficult for metal atom and silicon atom to have an oxidization reaction, a film containing nitrided metal and silicon, that is, the film 103 containing nitrogen, metal and silicon is disposed on the silicon dioxide film 105 by the reactive sputtering method using reactive gas including at least nitrogen atom, in the same way as the step of FIG. 3B.

The first step of the present invention is constructed from the steps of FIGS. 4B and 4C.

Figure 4D:
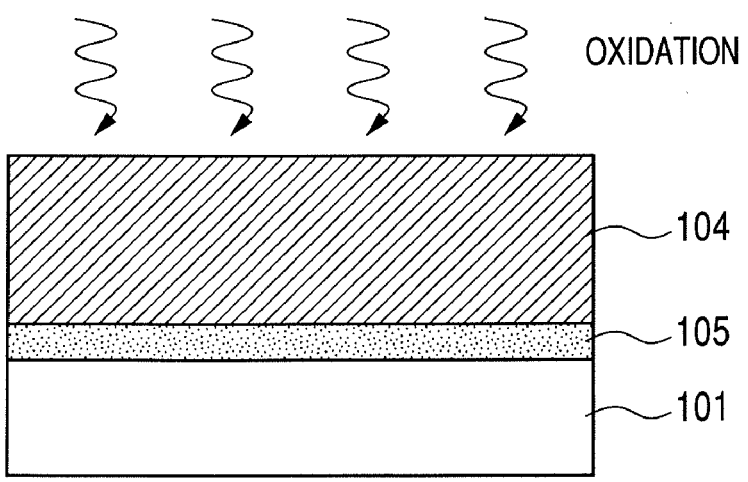
Figure 5A:
FIGS. 5A, 5B, 5C, 5D and 5E are step sectional views for describing one example of a method for manufacturing a conventional high permittivity constant dielectric films.
Figure 5B:
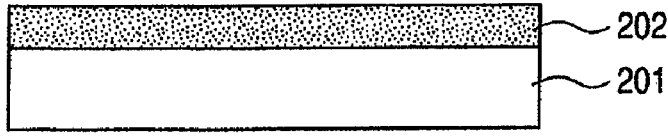
Figure 5C:
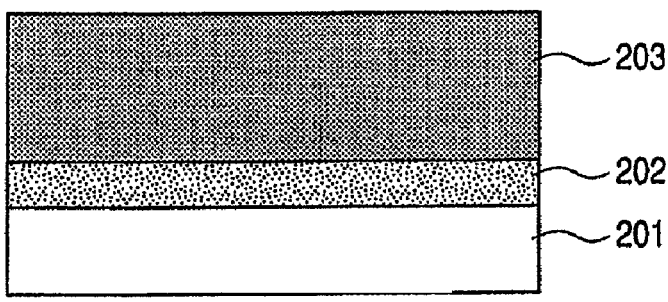
Figure 5D:
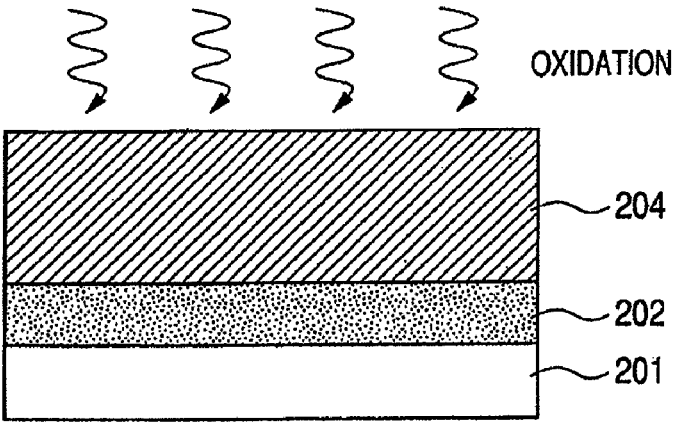
Figure 5E:
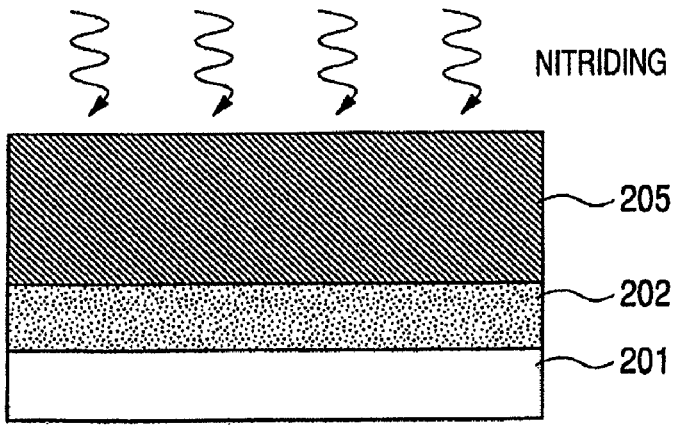
Figure 6A:
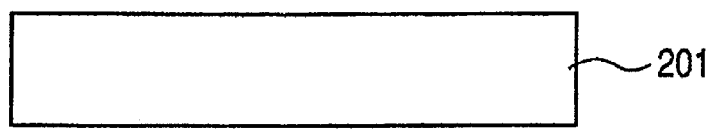
FIGS. 6A, 6B, 6C and 6D are step sectional views for describing another example of a method for manufacturing conventional high permittivity constant dielectric films.
Figure 6B:
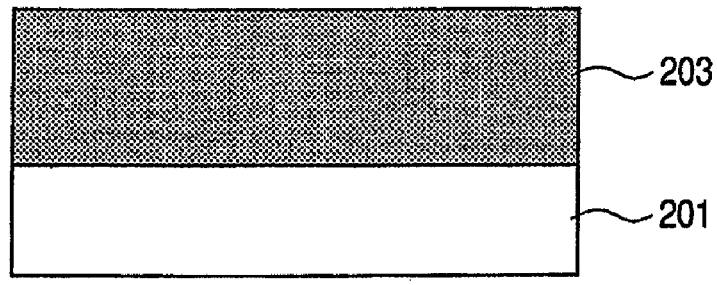
Figure 6C:
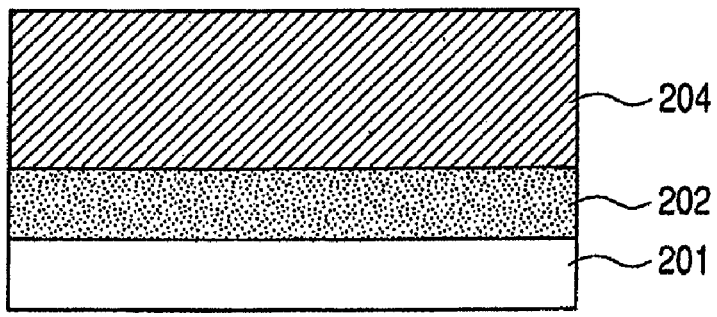
Figure 6D:
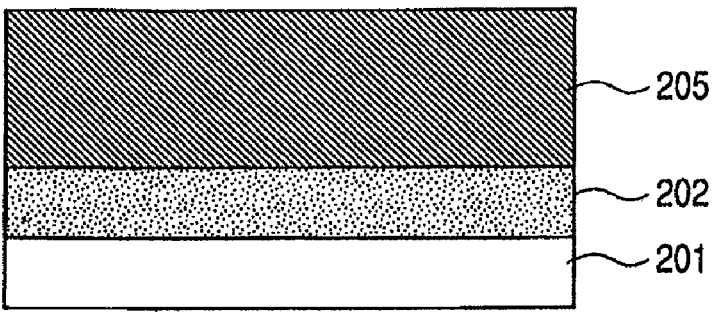

Next, in a step of FIG. 4D (a second step), the film 103 containing nitrogen, metal and silicon is oxidized in the same way as that of FIG. 3C. Hence, metal atom or silicon atom in the film 103 which has not completely been nitrided by reactive sputtering process is oxidized. Oxidization is implemented by a reaction in which a part of nitrogen atom bonded to metal atom and silicon atom is replaced by oxygen atom, or a reaction in which oxygen atom is inserted into between metal and nitrogen bonds and between silicon and nitrogen bonds. Such an oxidization reaction forms a metal nitride silicate film 104.

During the oxidization, a part of oxygen penetrates through the film 103 by diffusion.

For EOT to attain 1 mm or less, the first embodiment is optimum, but if the EOT is larger than 1 nm, preferably, a silicon dioxide film of approximately 1 nm is formed by, for example, the rapid thermal oxidizing method as in the second embodiment and then a film containing metal and silicon is formed and is nitrided before oxidization. This is because a good interface of silicon to the silicon dioxide film can be obtained. Specifically, the interface of silicon to the silicon dioxide film formed by thermal oxidization is good. Further, the silicon dioxide film formed in this way has good film quality, minuteness and resistance to oxygen permeability and therefore oxide films of approximately 1 nm are not increased in number, retaining an interface of silicon to the silicon dioxide film in a good state.

EXAMPLES

Hereinafter, using examples, a concrete applicable example of a method for forming dielectric films according to the present invention will be described below, but the present invention is not limited to these examples.

First Example

The present example was performed according to embodiments of FIGS. 1A through 1D. As the silicon substrate 101, a P-type single-crystal silicon substrate of 200 mm in diameter was used.

First, the surface of the silicon substrate 101 was cleaned by RCA cleaning to remove impurity and natural oxide film.

Next, the silicon substrate 101 was transferred into a RF magnetron type sputtering apparatus (not illustrated). As targets for the sputtering apparatus, Hf and Si were used. After the silicon substrate was transferred into the sputtering apparatus, exhaust was performed inside the sputtering apparatus to decompress to $2 \times 10^{-6}$ Pa. The silicon substrate 101 was heated by a heating unit and maintained at 300° C., thus exhausting oxygen or water which may oxidize Hf and Si during film deposit to the outside of the sputtering apparatus. Next, Ar gas was introduced into the sputtering apparatus at a flow rate of 5 sccm to maintain the sputtering apparatus inside at 0.2 Pa. Subsequently, a high-frequency voltage was applied to each of the targets to form plasma and Hf and Si atoms constituting the target were sputtered. The Hf and Si atoms sputtered at the each target were scattered to the silicon substrate 101 supported at a position opposing the target and were deposited on the silicon substrate 101. By this operation, the film 102 containing Hf and Si having a film thickness of 1 nm was formed. At this time, a composition ratio of Si to Hf included in the deposited film, that is, a percentage of Si atom to a total of Hf atom and Si atom was 30%.

Next, the silicon substrate 101 with the film 102 was transferred to the inside of a plasma nitrization apparatus (not illustrated) for generating nitriding plasma by surface wave excitation because the film 102 formed on a surface of the silicon substrate 101 was nitrided. The sputtering apparatus and the plasma nitriding apparatus are one of modules constructing a cluster apparatus for continuously performing a plurality of steps, and an area transferring a substrate between respective apparatuses was always maintained under a high vacuum condition. Accordingly, the substrate was retained in such an atmosphere that it is difficult for sputtered Hf and Si to have an oxidization reaction by oxygen remaining in the apparatus until nitriding was performed after sputtering.

In the plasma nitriding apparatus, $N_2$ gas was introduced at a flow rate of 200 sccm. Further, a pressure in the plasma nitriding apparatus was retained at 26 Pa. At this time, the silicon substrate 101 supported the substrate and retained the substrate at 200° C. with a stage building in a heater capable of heating. Subsequently, a microwave of 2.45 GHz was emitted from an antenna (not illustrated), which was introduced into the plasma nitriding apparatus through a dielectric (not illustrated) for separating the inside and outside of the apparatus and surface wave plasma was generated. By the nitrogen plasma excited in this way, the film 102 containing Hf and Si formed on a surface of the silicon substrate 101 was nitrided to generate a film containing nitrided Hf and Si, that is, the film 103 containing N, Hf and Si. The concentration (percentage content) of nitrogen atom in the film 103 was 25%.

Next, the substrate 101 with the film 103 was transferred to a plasma oxidization apparatus (not illustrated) constructing a cluster apparatus in the same way before oxidization. The plasma oxidization apparatus was an apparatus for generating oxidization plasma with surface wave excitation plasma in the same way as the plasma nitrization apparatus. In the plasma oxidization apparatus, $O_2$ gas was introduced at a flow rate of 1000 sccm. The pressure in the plasma oxidization apparatus was retained at 133 Pa. At this time, the silicon substrate 101 supported the substrate and retained the substrate at 350° C. with a stage building in a heater capable of heating. Subsequently, a microwave of 2.45 GHz was emitted from an antenna (not illustrated), which was introduced into the plasma oxidizing apparatus through a dielectric (not illustrated) for vacuum-separating the inside and outside of the apparatus and surface wave plasma was generated. By the oxidization plasma excited in this way, the film 103 containing nitrided Hf and Si on the silicon substrate 101 was oxidized to generate a nitrided Hf silicate film 104. Further, by the oxidization, Si of a surface portion of the silicon substrate 101 was oxidized to generate the silicon oxide film 105.

Observation of a cross section of a film formed in the above way by TEM has verified that the thin silicon oxide film 105 of a film thickness of 0.7 nm had been generated on the silicon substrate 101 and the nitrided Hf silicate film 104 of a film thickness of 1.6 nm had been generated thereon. Further, measurement of the concentration of nitrogen included in the nitrided Hf silicate film 104 by XPS has verified that as high-density nitrogen as 19 atoms % had been introduced in the film.

Second Example

The present example was performed according to embodiments of FIGS. 2A through 2E. As the silicon substrate 101, a P-type single-crystal silicon substrate of 200 mm in diameter was used.

First, in the same way as for the first example, a surface of the silicon substrate 101 was cleaned by RCA cleaning to remove impurity and native oxide film.

Next, the silicon substrate 101 was transferred to a rapid thermal oxidization apparatus and thermal oxidization was performed at 1,000° C. in the oxygen atmosphere. By the thermal oxidization, a silicon dioxide film 105 of 1.4 nm in film thickness was formed on the silicon substrate 101.

Next, the silicon substrate 101 with the film 105 is transferred into the sputtering apparatus for sputtering process in the same way as for the first example and a film 102 containing Hf and Si of 1 nm in film thickness was formed on the silicon dioxide film 105. At this time, a composition ratio of Si to Hf included in the deposited film, that is, a percentage of Si atom to a total of Hf atom and Si atom was 30%.

Next, the silicon substrate 101 with the films 105 and 102 was transferred into the plasma nitrization apparatus and the film 102 containing Hf and Si was nitrided by nitriding plasma in the same way as for the example 1. Hence, a film containing nitrided Hf and Si, that is, a film 103 containing N, Hf and Si was formed. The concentration (percentage content) of nitrogen atom in the film 103 was 25%.

Next, the silicon substrate 101 with the films 105 and 103 was transferred into the plasma oxidization apparatus and the film 103 containing N, Hf and Si was oxidized by oxygen plasma in the same way as for the example 1. Hence, a nitrided Hf silicate film 104 was formed.

Observation of a cross section of a film formed in the above way by TEM has verified that the silicon dioxide film 105 of 1.4 nm in film thickness had been formed on the silicon substrate 101 and a nitrided Hf silicate film 104 of 1.6 nm in film thickness had been formed thereon. Accordingly, it has been verified that there has occurred no increase in the thickness of the silicon dioxide film 105 by plasma oxidization.

Third Example

The present example was performed according to embodiments of FIGS. 3A through 3C. As the silicon substrate 101, a P-type single-crystal silicon substrate of 200 mm in diameter was used.

First, in the same way as for the first and second examples, a surface of the silicon substrate 101 was cleaned by RCA cleaning to remove impurity and native oxide film.

Next, the silicon substrate 101 was transferred into the sputtering apparatus. As targets for the sputtering apparatus, Hf and Si were used. After the silicon substrate was transferred into the sputtering apparatus, exhaust was performed inside the sputtering apparatus to decompress to $2 \times 10^{-6}$ Pa. The silicon substrate 101 was heated by a heating unit and maintained at 300° C., thus exhausting oxygen or water which may oxidize Hf and Si during film deposit to the outside of the sputtering apparatus. Next, Ar gas was introduced at a flow rate of 5 sccm and $N_2$ gas was introduced at a flow rate of 0.5 sccm into the sputtering apparatus, respectively, to maintain the sputtering apparatus inside at 0.2 Pa. Subsequently, a high-frequency voltage was applied to each of the targets to form plasma and Hf and Si atoms constituting the target were sputtered. The Hf and Si atoms sputtered at the each target reacted to nitrogen atom in plasma to become a nitride, which was deposited on the silicon substrate 101. By the reactive sputtering, a 1.5 nm thick film containing nitrided Hf and Si, that is, the film 103 containing N, Hf and Si was formed. At this time, a composition ratio of Si to Hf included in the deposited film, that is, a percentage of Si atom to a total of Hf atom and Si atom was 30%. The concentration (percentage content) of nitrogen atom in the film 103 was 28 atom %.

Next, in the same way as for the first example, the film 103 containing N, Hf and Si was oxidized by oxygen plasma to form a nitrided Hf silicate film 104. Further, by the oxidization, Si of a surface layer portion of the silicon substrate 101 was oxidized to form a silicon dioxide film 105.

Observation of a cross section of a film formed in the above way by TEM has verified that the thin silicon dioxide film 105 of a film thickness of 0.6 nm had been formed on the silicon substrate 101 and the nitrided Hf silicate film 104 of a film thickness of 1.6 nm had been formed thereon. Further, measurement of the concentration of nitrogen included in the nitrided Hf silicate film 104 by XPS has verified that as high-density nitrogen as 23 atoms % had been introduced in the film.

Fourth Example

The present example was performed according to embodiments of FIGS. 4A through 4D. As the silicon substrate 101, a P-type single-crystal silicon substrate of 200 mm in diameter was used.

First, in the same way as for the first to the third examples, a surface of the silicon substrate 101 was cleaned by RCA cleaning to remove impurity and native oxide film.

Next, in the same way as for the second example, the silicon substrate 101 was thermally oxidized to form a silicon dioxide film 105 of 1.4 nm in film thickness.

Next, the silicon substrate 101 with the film 105 was transferred into the sputtering apparatus for reactive sputtering in the same way as for the third example and a 1.5 nm thick film containing nitrided Hf and Si, that is, a film 103 containing N, Hf and Si was formed on the silicon dioxide film 105. At this time, a composition ratio of Si to Hf included in the deposited film, that is, a percentage of Si atom to a total of Hf atom and Si atom was 30%. The concentration (percentage content) of nitrogen atom in the film 103 was 28 atom %.

Next, in the same way as for the second example, the film 103 containing N, Hf and Si was oxidized by oxygen plasma to form the nitrided Hf silicate film 104.

Observation of a cross section of a film formed in the above way by TEM has verified that the silicon dioxide film 105 of 1.4 nm in film thickness had been formed on the silicon substrate 101 and a nitrided Hf silicate film 104 of 1.6 nm in film thickness had been formed thereon. Accordingly, it has been verified that there has occurred no increase in the thickness of the silicon dioxide film 105 by plasma oxidization.

Fifth Example

In the present example, there was performed an electrical property evaluation on high permittivity constant insulation film formed in accordance with a method for forming an insulation film according to the present invention.

As the silicon substrate 101, there was used the one made of single-crystal silicon and having (100) plane orientation, doped phosphorus and a resistance value of approximately 0.1 Ω·cm. First, after a surface of the silicon substrate 101 was element-separated according to LOCOS method, high permittivity constant dielectric films were formed in the same way as for the second example. Next, 5-second anneal was performed at 1,000° C. in a nitrogen atmosphere. Sequentially, an electrode made of gold was formed on the insulation film to form MOS capacitor and C-V properties and I-V properties were evaluated.

As a result, an oxidized film conversion film thickness of the insulation film was 1.61 nm and a flat band voltage (Vfb) was 0.33 V and the hysteresis of a C-V curve was 30 mV. A leakage current value was $2.4 \times 10^{-6}$ A/cm$^2$ (Vg=Vfb−1 V), which was a good result.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-336731, filed on Dec. 27, 2007, which is hereby incorporated by reference herein in its entirety.

What is claimed is:

1. A method for forming a dielectric film including metal nitride silicate on a silicon substrate, comprising:
   a first step of depositing a film containing metal and silicon on the silicon substrate in a non-oxidizing atmosphere using a sputtering method;
   a second step of forming a film containing nitrogen, metal and silicon by nitriding the film containing metal and silicon using plasma containing at least a nitrogen atom at a temperature in which an amorphous state can be maintained; and
   a third step of forming a metal nitride silicate film by oxidizing the film containing nitrogen, metal and silicon using microwave plasma having an electronic temperature of 2 eV or less and containing at least oxygen,
   wherein a ratio of silicon atoms to a total of metal atoms and silicon atoms in the metal nitride silicate film is 10 atom % or more, and
   wherein in the third step, at least a part of the silicon substrate which is in contact with the metal nitride silicate film is oxidized.

2. The method for forming a dielectric film according to claim 1, wherein the metal includes at least either one of hafnium and zirconium.

3. The method for forming a dielectric film according to claim 1, further comprising retaining the film containing metal and silicon in a non-oxidizing atmosphere during a period from completion of the first step to start of the second step.

4. The method for forming a dielectric film according to claim 1, further comprising oxidizing a surface of the silicon substrate under the film containing nitrogen, metal and silicon in the third step to form a silicon oxide film.

5. The method for forming a dielectric film according to claim 1, wherein the first step is conducted under a condition of a partial pressure of $1 \times 10^{-5}$ Pa or less.

6. A method for forming a dielectric film including metal nitride silicate on a silicon substrate, comprising:
   a first step of oxidizing a surface of the silicon substrate to form a silicon oxide film and thereafter depositing a film containing metal and silicon on the silicon substrate in a non-oxidizing atmosphere using a sputtering method without removing the silicon oxide film formed in the first step;
   a second step of forming a film containing nitrogen, metal and silicon by nitriding the film containing metal and silicon using plasma containing at least a nitrogen atom at a temperature in which an amorphous state can be maintained; and
   a third step of forming a metal nitride silicate film by oxidizing the film containing nitrogen, metal and silicon using plasma containing at least oxygen;
   wherein in the third step at least a part of the silicon substrate which is in contact with the metal nitride silicate film is oxidized.

* * * * *